United States Patent [19]

Spraggins et al.

[11] Patent Number: 4,961,426
[45] Date of Patent: Oct. 9, 1990

[54] METHOD FOR RETROSPECTIVELY GATING NMR DATA

[75] Inventors: Thomas A. Spraggins, Vienna, Va.; Steven F. Owens, Pearl River, N.Y.

[73] Assignee: Siemens Medical Systems, Inc., Iselin, N.J.

[21] Appl. No.: 234,229

[22] Filed: Aug. 19, 1988

[51] Int. Cl.⁵ ............................................ A61B 5/055
[52] U.S. Cl. .............................................. 128/653 A
[58] Field of Search .................. 128/653; 324/309, 312

[56] References Cited

U.S. PATENT DOCUMENTS

| | | | |
|---|---|---|---|
| 4,684,890 | 8/1987 | Briguet et al. | 324/309 |
| 4,694,837 | 9/1987 | Blakeley et al. | 128/653 |
| 4,710,717 | 12/1987 | Pelc et al. | 128/653 |
| 4,712,560 | 12/1987 | Schaefer et al. | 128/653 |
| 4,751,462 | 6/1988 | Glover et al. | 324/309 |
| 4,905,699 | 3/1990 | Sano et al. | 128/721 |

FOREIGN PATENT DOCUMENTS

| | | | |
|---|---|---|---|
| 0168691 | 1/1981 | European Pat. Off. | 128/653 |
| 0182265 | 5/1986 | European Pat. Off. | 324/309 |

Primary Examiner—Ruth S. Smith
Assistant Examiner—John D. Zele
Attorney, Agent, or Firm—Mark H. Jay

[57] ABSTRACT

NMR imaging data are acquired using a variable phase-encoding gradient. NMR non-imaging data are acquired using fixed phase-encoding, and motion data are derived from such NMR non-imaging data. Gating data are extracted from the motion data and used to select from the NMR imaging data to produce gated image data. The gated image data are used to produce a reconstructed image.

10 Claims, 5 Drawing Sheets

FIGURE: APPROXIMATELY 10 SECONDS' WORTH OF THE RAW TIMING DATA (A), THE FILTERED DATA (B), AND THE COMPUTER-DERIVED "ECG" SIGNALS FED INTO THE RETROSPECTIVE GATING ALGORITHM (C).

| | | | | |
|---|---|---|---|---|
| IMAGE 1, LINE 1 | 1 | | IMAGE 1, LINE 1 | 1 |
| IMAGE 1, LINE 2 | 4 | | IMAGE 2, LINE 1 | 2 |
| IMAGE 1, LINE 3 | 7 | | IMAGE 3, LINE 1 | 3 |
| IMAGE 2, LINE 1 | 2 | | IMAGE 1, LINE 2 | 4 |
| IMAGE 2, LINE 2 | 5 | RESHUFFLE | IMAGE 2, LINE 2 | 5 |
| IMAGE 2, LINE 3 | 8 | | IMAGE 3, LINE 2 | 6 |
| IMAGE 3, LINE 1 | 3 | | IMAGE 1, LINE 3 | 7 |
| IMAGE 3, LINE 2 | 6 | | IMAGE 2, LINE 3 | 8 |
| IMAGE 3, LINE 3 | 9 | | IMAGE 3, LINE 3 | 9 |

METHOD FOR RETROSPECTIVELY GATING NMR DATA

BACKGROUND OF THE INVENTION

The invention relates to NMR imaging, and more particularly relates to the production of NMR images which are gated in accordance with body motion of a living patient. In its most immediate sense, the invention relates to retrospective gating of NMR images without direct monitoring of a patient's body processes.

Diagnosticians have long used gated images when diagnosing moving body parts. For example, when conducting a heart study, it is advantageous to isolate images which relate to one or more predetermined phases of the cardiac cycle. Thus, a physician may wish to view a series of images which all relate to the patient's heart at various points in his ECG.

One way in which such gated images have been produced for cardiac imaging applications is to connect appropriate electrodes to the patient and to monitor the patient's ECG while the patient is undergoing an NMR study. This technique has proved unsatisfactory. This is because the intense magnetic fields and pulsed magnetic field gradients used in NMR often interfere with the patient's ECG signal. As a result, in an attempt to find electrode locations which produce satisfactory ECG signals, it is frequently necessary to repeatedly start an NMR study, stop the study when the ECG signal proves unsatisfactory, withdraw the patient from the NMR unit, and reposition the electrodes. All this is time-consuming, and therefore expensive (considering the high costs of operating an NMR unit).

It is also known to gate NMR data using a priori assumptions about periodic motion which is used to drive the gating process. For example, European Patent Application No. 0 182 265 teaches the concept of empirically determining an average breathing rate using a constant phase-encoding gradient and then using that average rate to gate a subsequent imaging study. This is unsatisfactory because body processes are not exactly regular.

It is additionally known to gate NMR data retrospectively. This is illustrated by U.S. Pat. No. 4,710,717, which teaches the concept of varying the phase-encoding gradient in accordance with the cardiac cycle and interpolating the NMR data as necessary to produce appropriate images. This is not generally applicable because it is necessary to sense the ECG directly.

In none of these known techniques is it possible to simply and accurately gate NMR data retrospectively in accordance with any arbitrarily-selected body motion without undue consumption of expensive study time.

SUMMARY OF THE INVENTION

One object of the invention is to provide a method for retrospectively gating NMR data which can be used with any body motion, whether caused by voluntary muscular action or involuntary muscular action.

Another object is to provide such a method which can be used to gate image data from one slice and possibly many slices through the body of a living patient using motion data derived from another slice through the patient.

A further object is to provide such a method which can be used to gate image data from one echo using motion data derived from another echo.

A still further object of the invention is to provide such a method which does not depend upon intrinsically inaccurate a priori assumptions about the regularity of body processes.

Still another object is to provide such a method which can be carried out on existing NMR units and computer systems without requiring hardware modifications.

Yet a further object is, in general, to improve on known methods of this general type.

In accordance with the invention, NMR imaging data is acquired using a variable phase-encoding gradient. NMR nonimaging data is acquired using fixed phase-encoding, and motion data is derived from this NMR non-imaging data. Gating data is extracted from the motion data, and gated image data is selected in accordance with the gating data and used to produce a reconstructed NMR image.

In the preferred embodiment, NMR imaging data are calculated, as by interpolation, where existing data do not exactly correspond to the desired data. Advantageously, gating data are derived by software filtering and peak-detection of the motion data.

The invention proceeds from a realization that when the same phase-encoding line is repetitively acquired, i.e. when NMR data (spin-echo data or gradient-echo data) of a particular slice of the patient's body is acquired using a net phase-encoding which does not change, changes in the data are reflective only of system noise and physical motion of the imaged slice. By reducing the noise, it is possible to accurately evaluate this physical motion, and to use it to gate conventional NMR imaging data (which are acquired using a varying phase-encoding gradient).

Because the invention relies on simple physical motion of the living patient, it is generally useful and requires only routine adaptation for whatever application is desired. Thus, it is not only possible to conduct retrospectively gated cardiac studies, but it would also be possible to conduct a retrospectively gated study of the temporal mandibular joint by instructing the patient to chew gum during an NMR study. Furthermore, because the gating data need not come from the slice of the body which is being imaged, it would be possible to, e.g., retrospectively gate an NMR study of the liver or the cerebrospinal fluid using e.g. the cardiac cycle.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENTS

The following description has been written with specific reference to gated cardiac studies. This is only for purposes of illustration; the invention is not limited to cardiac studies. Furthermore, the following description has been written with specific reference to the Siemens MAGNETOM (not specifically shown). This is likewise for purposes of illustration and the invention can be used on any NMR imager/computer system with appropriate software modification. Additionally, the following description has been written on the assumption that a living patient (not shown), usually but not necessarily a human being, is subjected to an NMR study in the MAGNETOM and that at least one slice of the patient is imaged in the study.

Figure 1:
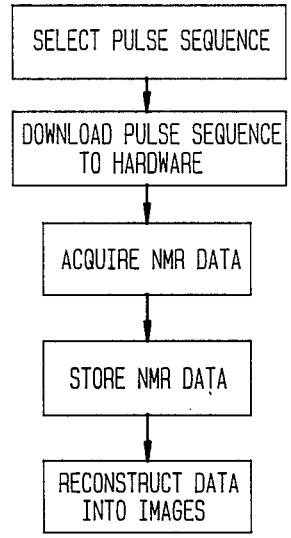
FIG. 1 is a flowchart showing how a double gradient echo sequence, shown schematically, is used in an NMR imager to produce reconstructed NMR images.
Figure 1:
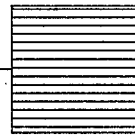
Figure 1:
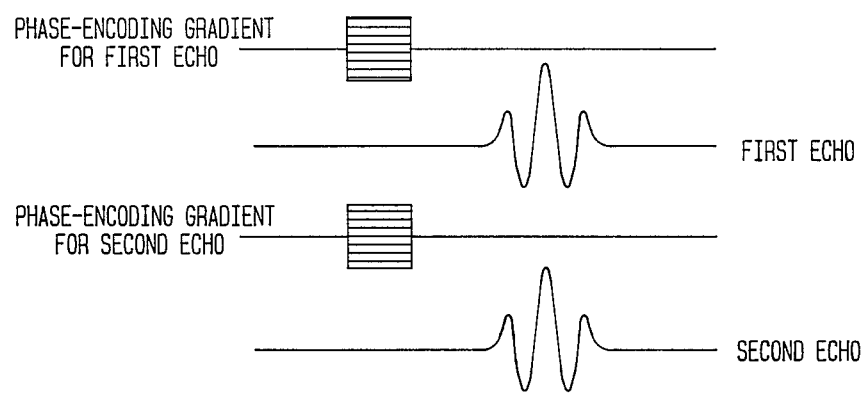

FIG. 1 will first be discussed to explain the environment in which the invention is used. As is shown there, a conventional NMR unit, such as a Siemens MAGNETOM, is used to produce NMR images of slices of a patient by using a double gradient-echo sequence. (This is not a part of the invention; a spin-echo sequence could be used as well.) First, the appropriate pulse sequence is selected and downloaded into the hardware. Then, data is acquired.

Data acquisition proceeds, in each of the two echos, by stepping the gradient field between a minimum value and a maximum value in small steps. (In the Siemens unit, there are typically 256 such steps, but this is not part of the invention.) Thus, data are first acquired at the minimum (i.e. most negative) phase-encoding gradient (the so-called first phase-encoding line). Next, the phase-encoding gradient is increased, and data are acquired once more. This process is repeated until, at the center line of the gradient table (usually line 129), the phase-encoding gradient is zero. Next, the phase-encoding gradient is once again increased, to a positive value, data are acquired, and this process is repeated until the phase-encoding gradient is at its maximum (i.e. most positive) value, which typically occurs at line 256 of the gradient table.

After all the data have been acquired in each of the two echos, the raw data is stored. The NMR images are then reconstructed.

Figure 2:
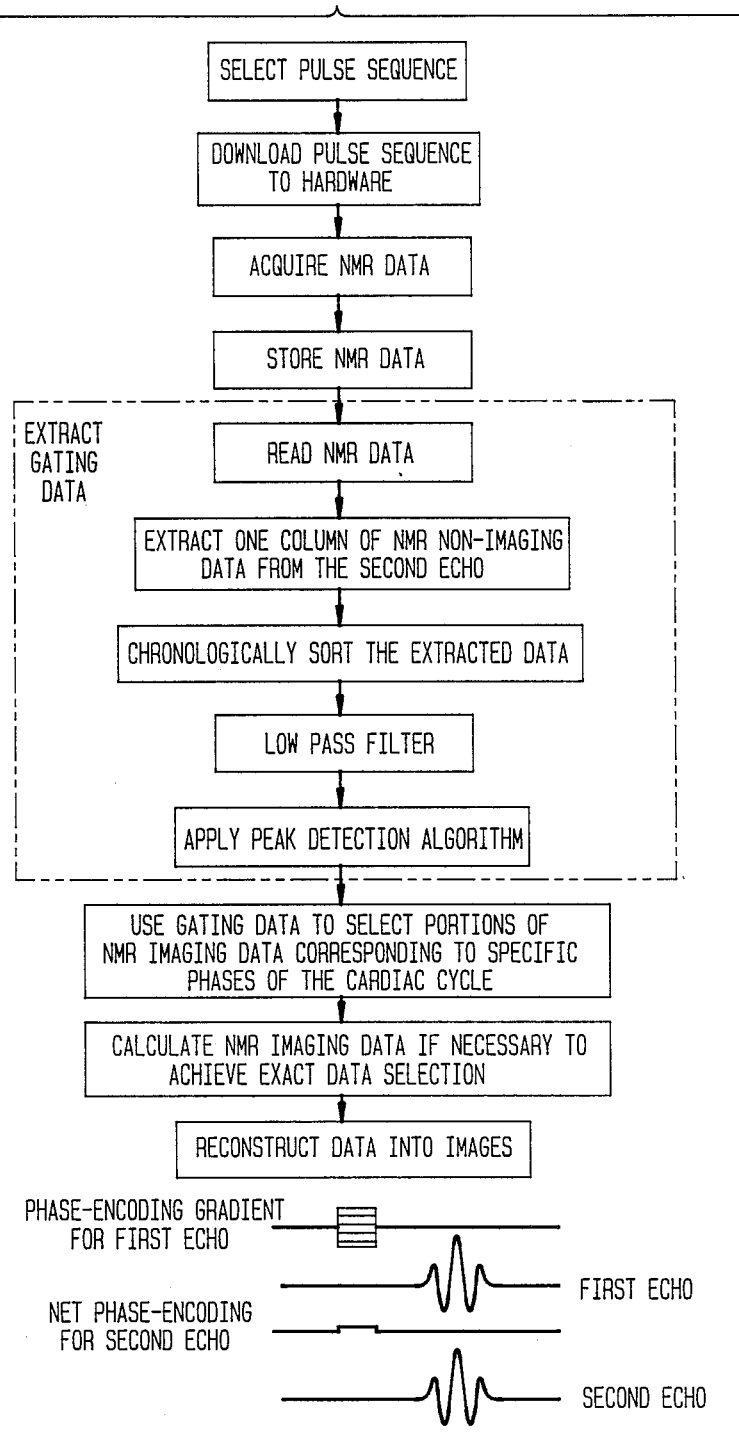
FIG. 2 is a flowchart showing how a preferred embodiment of the invention is used in an NMR imager to produce retrospectively gated NMR images.

In accordance with the invention, the data acquisition process for the first echo is identical to that just described. However, as is schematically shown in FIG. 2, the data acquisition process for the second echo is different, in that such phase-encoding gradients are applied as will produce a net phase-encoding which is at a constant value, rather than being stepped through a gradient table, as in the case of the first echo. (In the preferred embodiment, this value is approximately 10% of the normal maximum phase-encoding. At this point it is only necessary to know that the phase-encoding is held constant and that the data acquisition process is repeated using the same gradient field.)

Phenomena like cardiac activity, respiration, digestion, deliberate muscle movement, etc. cause physical movement of the body. Where the second echo (the echo in which a constant net phase-encoding is repeatedly used) is derived from a slice of the patient's body which moves as a result of such phenomena, the variation in the NMR data will reflect such movement. Thus, changes in the NMR data acquired during the second echo represent motion; where the motion is periodic, as in the case of cardiac activity, respiration, periodic voluntary motion, etc., changes in the NMR data acquired represent not merely motion, but timing. The NMR data acquired while the phase-encoding amplitude is invariant are herein referred to as "NMR non-imaging data", and the changes in such data are herein referred to as "motion data".

In accordance with the invention, the motion data are used as a source of gating data (e.g. ECG pulses). Then, NMR imaging data acquired during the first echo is selected, in accordance with the gating data, and only the selected data are used to form an image.

Where the imaging data and the non-imaging data are acquired from the same slice and using a double echo technique, it is necessary to apply corrective phase-encoding gradients so that the net phase-encoding during the second echo is at the appropriate constant value. Where the imaging data and the non-imaging data are acquired from different slices or by using two single echos, no corrective phase-encoding gradients are needed because there is no residual phase-encoding remaining from a previous gradient pulse.

Figure 3:
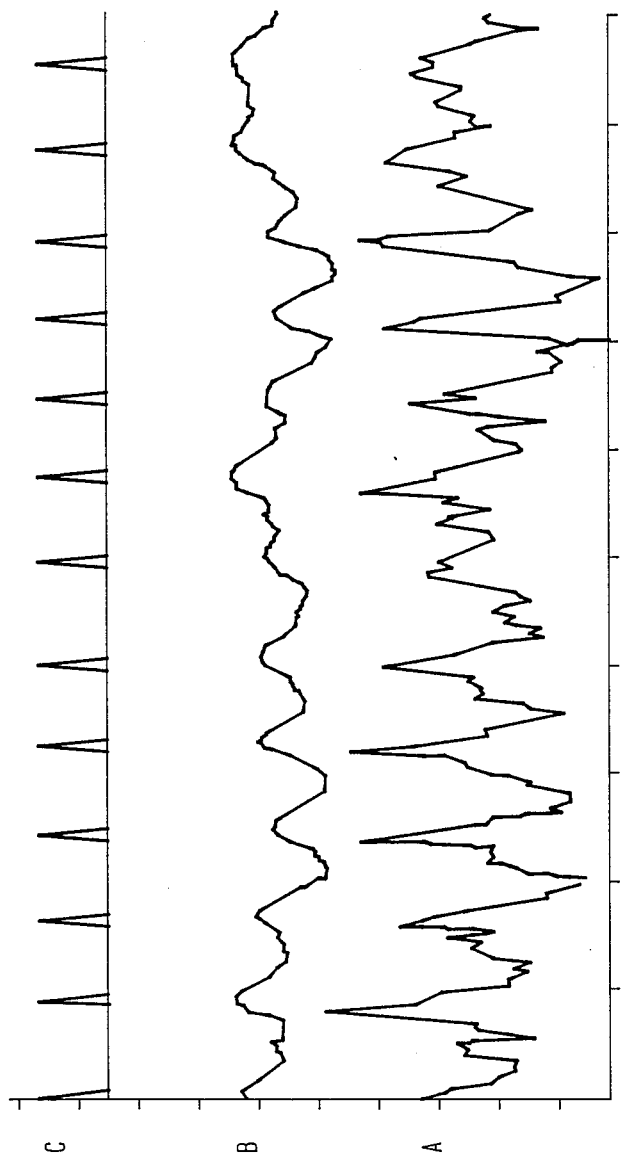
FIG. 3 shows, in schematic form, how gating data, filtered motion data and motion data relate to each other in accordance with the preferred embodiment of the invention.

The details of the preferred embodiment will be described further below, but the general results of the invention are illustrated in FIG. 3. Line A in FIG. 3 represents motion data which relates to a slice of a patient's body that includes the heart. (Because the motion of the heart is periodic, line A has a periodic appearance. Also, because the motion of the heart is not completely uniform, line A is not precisely periodic.) Line B in FIG. 3 represents the results of filtering the line A data through a low-pass software filter, and line C in FIG. 3 represents the results of subjecting the line B data to a software peak-detection algorithm. Line C is therefore an artificially-generated ECG signal, which can be used to gate the NMR imaging data. While the low-pass filtering and the peak-detection are carried out by software in the preferred embodiment, it would alternatively be possible to realize these functions in hardware.

The motion data are derived from successive changes in the NMR non-image data. Such changes are only meaningful if the NMR non-image data are ordered chronologically. Therefore, if the NMR non-image data are not, after acquisition, stored in chronological order, they must be sorted into chronological order before being used to derive motion data. This is what was done in the preferred embodiment of the invention, as is described below.

The preferred embodiment of the invention was realized on a Siemens MAGNETOM, with appropriately modified software. The nature of the modifications and reasons for them will now be explained with reference to FIG. 4 and later Figures.

The Siemens MAGNETOM, like all other conventional NMR imagers, is set up to acquire a plurality of images. To do this, the gradient field is set initially at the minimum phase-encoding gradient. Then, the data for the first image are acquired, the data for the second image are acquired, the data for the third image are acquired and so on until data for all the desired images have been acquired.

Only after all this has taken place is the gradient field stepped to the next (here, next larger) phase-encoding gradient. Then, the data for the desired images are acquired at this next line (i.e. line 2). After data for all the desired images have been acquired, the phase-encoding gradient is incremented once again, and the image data for line 3 are then acquired. This process is then repeated until all image data for all the images desired have been acquired for all (normally, 256) lines.

Figures 4, 5:
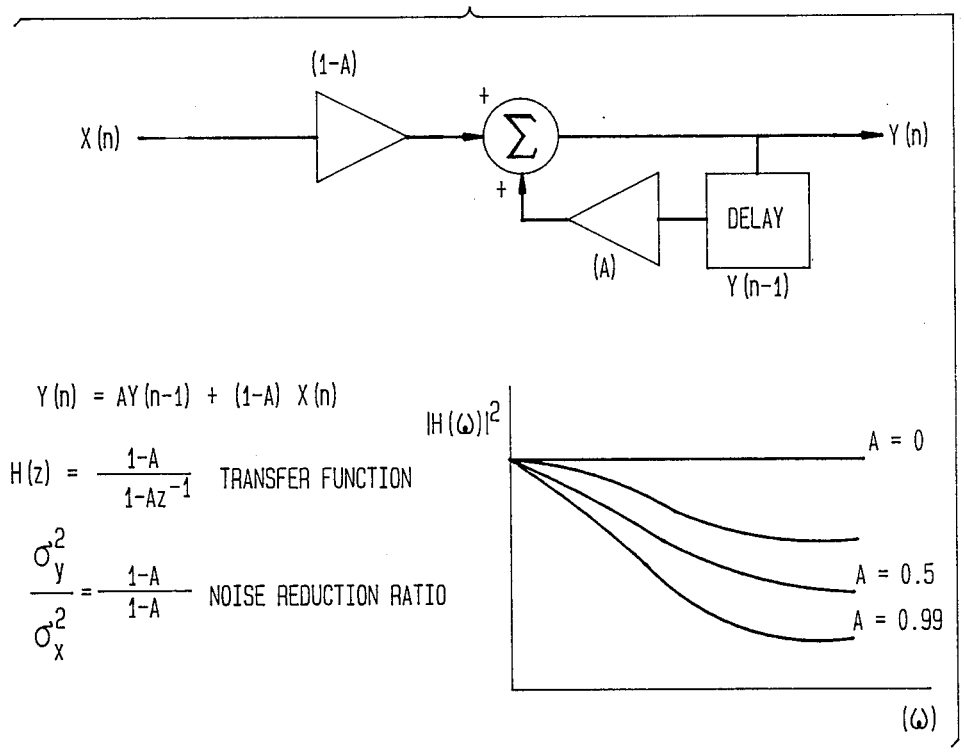
FIG. 4 shows how NMR data for a plurality of NMR images are acquired in a Siemens MAGNETOM and how such data are chronologically sorted in accordance with the preferred embodiment of the invention.
FIG. 5 shows the low pass filter which is used in accordance with the preferred embodiment of the invention.

In implementing the invention, the software used together with the Siemens MAGNETOM was modified. The modification was that the NMR non-image data were acquired with a constant net gradient amplitude, rather than with gradient amplitudes which were stepped through a table. FIG. 4 illustrates that the NMR non-image data therefore needed to be sorted chronologically, so that changes in the data would be correlated with the physical motion in the slice of interest.

Figure 6:
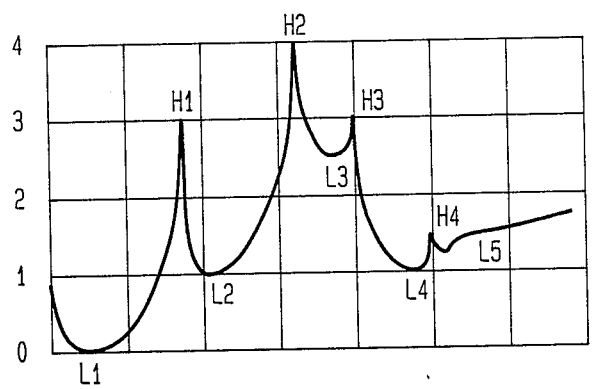
FIG. 6 shows the peak-detection algorithm which is used in accordance with the preferred embodiment of the invention.
Figure 6:
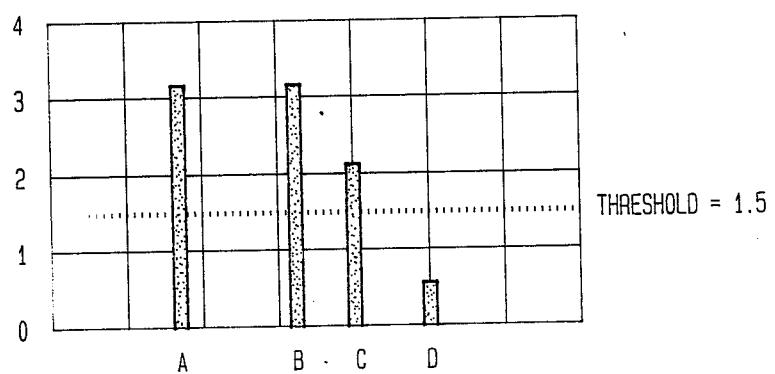

Therefore, in the preferred embodiment, and with specific reference to FIG. 2 once again, the NMR non-image data is sorted chronologically and a particular column of NMR non-image data is chosen as the preferred source for motion data. Advantageously, the column is chosen first and the sorting is carried out afterward; this reduces the volume of data which must be sorted and therefore reduces the time required for processing the data. The chosen and sorted data are then used to derive motion data. The motion data are then filtered using a software low-pass filter which is shown in FIG. 5 and subjected to a software peak-detection algorithm which is shown in FIG. 6. This produces gating data. Then, the gating data which is so derived, and which in this example is an artificially-generated ECG signal, is used to select NMR imaging data of interest from all of the NMR imaging data. Advantageously, where such NMR imaging data cannot be selected because they do not exist, the data are computed (as by some interpolation scheme) between known data points. Finally, the selected or computed data are used to reconstruct the final NMR image.

In practice, the motion data contains noise and such noise must be reduced to provide usable gating data. In the preferred embodiment, the first step in such noise reduction is low-pass filtration. The filter used is recursive (i.e. the filter uses feedback) and has the characteristics shown in FIG. 5. Experiments suggest that an appropriate optimization of the lowpass filter occurs when the variable A is set at 0.85, but this is not part of the invention because there are many low-pass filter algorithms and the algorithm chosen will in part depend on the type of motion which is being used as a source of gating data.

The results of the preferred low-pass filter are illustrated at line B, FIG. 3. As is evident therefrom, there is still a substantial variation in amplitude and it would be advantageous, if not absolutely necessary, to detect the peaks in line B. This is carried out by the algorithm illustrated in FIG. 6.

The algorithm operates as follows:

The filtered motion data is scanned and all local maxima and minima are noted. Then, for each local maximum, the amplitude differences between that maximum and the two closest local minima are computed. Whichever difference is greater is the difference which is used.

If the difference exceeds a predetermined threshold, the local maximum is taken to be a genuine peak and is used as gating data. If, on the other hand, the difference does not exceed this threshold, the local maximum is taken to be a noise spike and is rejected as gating data. In this example, the noise threshold is established at 1.5 units, but this is not part of the invention and will vary in accordance with the motion which is being monitored.

Generally, the peak-detection algorithm identifies local maxima which are so far separated in amplitude from adjacent local minima that they can be said to represent physical motion and not merely noise spikes. Thus, in the example illustrated, maxima occur at times A, B, C and D. The differences between the two local minima adjacent time A are three units and two units respectively, and the difference which is used for purposes of threshold comparison is the larger of these, namely three. Since this exceeds the threshold of 1.5 units, time A is taken as a genuine unit of gating data. For the maximum at time B, the relevant differences are 3 and 1.5 units respectively, and time B is taken as a genuine unit of gating data because the larger difference (3) exceeds the threshold (1.5). The maximum at time C likewise indicates that time C is a genuine unit of gating data, but the maximum at time D is not. This is because the relevant differences are 0.5 and 0.25 units, respectively, and the larger of these (0.5) is smaller than the threshold (1.5).

There is thus produced a set of gating data which can be used to select from the available set of NMR imaging data. In practice, a diagnostician identifies times at which he wishes to have NMR images, and these times are then related to the gating data which have actually been acquired. Then, selections are made from the set of NMR imaging data in accordance with the times so identified; if appropriate NMR imaging data does not exist for a particular time, the data are produced by calculation between times for which the data is available.

The phase-encoding gradient selected in the preferred embodiment is that which corresponds to line 143 in the gradient table. While line 143 does not have the same signal-to-noise ratio as does line 129 (the signal-to-noise ratio is maximum at line 129 and decreases steadily towards lines 1 and 256), the 14 contrast-to-noise ratio of this line is adequate and it is more sensitive to motion of the patient; this sensitivity is more 16 important than signal-to-noise ratio for purposes of this invention.

The NMR imaging data may be, but need not be, derived from the same slice as the NMR non-imaging data. In for example the case of a cardiac study, the slice will likely be the same in both cases, but this need not be so. However, if the diagnostician wishes to gate a liver study as a function of cardiac activity, the slices will differ. Furthermore, the motion involved need not be of the involuntary type (e.g. pulse, respiration, etc.) Where a diagnostician wishes to conduct a study of the temporal mandibular joint, the patient may be instructed to chew gum while undergoing an NMR study.

Those skilled in the art will understand that changes can be made in the preferred embodiments here described, and that these embodiments can be used for other purposes. Such changes and uses are within the scope of the invention, which is limited only by the claims which follow.

We claim:

1. A method for retrospectively gating NMR data in accordance with body motion of a living patient, comprising the following steps:

acquiring NMR imaging data using a variable phase-encoding gradient;

acquiring NMR non-imaging data using a constant phase-encoding gradient;

deriving motion data from said NMR non-imaging data;

extracting gating data from said motion data;

selecting, from said imaging data and in accordance with said gating data, gated image data which relates to at least one specific part of the body motion of interest; and using said gated image data to produce a reconstructed NMR image.

2. The method of claim 1, wherein said step of selecting comprises the step of generating said image data by computation.

3. The method of claim 1, wherein said extracting step comprises the steps of filtering said motion data through a low-pass filter and subjecting the resulting filtered motion data to a peak-detection algorithm.

4. The method of claim 1, wherein said imaging data acquisition step is carried out using one echo and said non-imaging data acquisition step is carried out using another echo.

5. The method of claim 4, further comprising the step of chronologically sorting the NMR imaging data which are acquired during said another echo, and wherein said extracting step comprises the step of extracting, from said chronologically sorted NMR imaging data, a column of data.

6. The method of claim 1, wherein said NMR imaging data is acquired from one slice through the body of the living patient and said non-imaging data is acquired from another slice through said body and said one slice is different from said another slice.

7. The method of claim 1, wherein said acquisition steps are carried out with respect to a single slice through the body of the living patient.

8. A method for retrospectively gating NMR data in accordance with the cardiac cycle of a living patient, comprising the following steps:

establishing a slice of the patient's body, which slice includes the patient's heart;

acquiring NMR imaging data using a variable phase-encoding gradient;

acquiring NMR cardiac non-imaging data, which non-imaging data represents the cardiac cycle of the patient's heart, from said slice using a constant phase-encoding gradient;

deriving cardiac timing data from said NMR cardiac non-imaging data;

extracting an artificially-generated ECG signal from said cardiac timing data;

selecting, from said imaging data and in accordance with said artificially-generated ECG signal, gated image data which relates to at least one point in the cardiac cycle of the patient; and reconstructing, from said gated image data, at least one NMR image which is gated in accordance with the patient's cardiac cycle.

9. The method of claim 8, wherein said selecting step comprises the step of identifying a plurality of points in the cardiac cycle of the patient and said reconstructing step comprises the step of reconstructing a plurality of NMR images.

10. A method for retrospectively gating NMR data in accordance with periodic body motion of a living patient, comprising the following steps:

establishing a slice of the patient's body, which slice experiences the periodic body motion of interest;

acquiring NMR imaging data using a variable phase-encoding gradient;

acquiring NMR non-imaging data, which data represents the periodic body motion of interest, from said slice using a constant phase-encoding gradient;

deriving timing data from said NMR non-imaging data;

extracting an artificially-generated timing signal from said timing data;

selecting, from said imaging data and in accordance with said artificially-generated timing signal, gated image data which relates to at least one point in the periodic body motion of interest; and reconstructing, from said gated image data, at least one NMR image which is gated in accordance with said periodic body motion.

* * * * *

UNITED STATES PATENT AND TRADEMARK OFFICE
CERTIFICATE OF CORRECTION

PATENT NO. : 4,961,426

DATED : October 9, 1990

INVENTOR(S) : Thomas A. Spraggins, Vienna, VA
Steven F. Owens, Pearl River, NY

It is certified that error appears in the above-identified patent and that said Letters Patent is hereby corrected as shown below:

In the Claims

Column 7:

Claim 5, lines 2 and 5-6: Change "imaging" to --non-imaging--.

Signed and Sealed this

Twenty-fourth Day of November, 1992

Attest:

DOUGLAS B. COMER

Attesting Officer     Acting Commissioner of Patents and Trademarks